United States Patent [19]

Maeda

[11] Patent Number: 4,794,563

[45] Date of Patent: Dec. 27, 1988

[54] SEMICONDUCTOR MEMORY DEVICE HAVING A HIGH CAPACITANCE STORAGE CAPACITOR

[75] Inventor: Satoshi Maeda, Yokohama, Japan

[73] Assignee: Kabushiki Kaisha Toshiba, Kawasaki, Japan

[21] Appl. No.: 925,547

[22] Filed: Oct. 31, 1986

[30] Foreign Application Priority Data

Nov. 20, 1985 [JP] Japan .................................. 60-260452

[51] Int. Cl.[4] ...................... G11C 11/34; G11C 11/24; H01L 29/78; H01L 27/02

[52] U.S. Cl. .................................... 365/182; 365/149; 357/23.6; 357/41

[58] Field of Search ................. 357/23.6, 41; 365/182, 365/149

[56] References Cited

U.S. PATENT DOCUMENTS

| | | | |
|---|---|---|---|
| 4,335,450 | 6/1982 | Thomas | 365/182 |
| 4,613,889 | 9/1986 | Kuo | 365/182 |
| 4,672,410 | 6/1987 | Miura et al. | 357/55 |
| 4,673,962 | 7/1987 | Chatterjee et al. | 365/149 |
| 4,688,063 | 8/1987 | Lu et al. | 365/149 |
| 4,688,064 | 8/1987 | Ogura et al. | 357/41 |

Primary Examiner—Terrell W. Fears
Assistant Examiner—Melissa J. Koval
Attorney, Agent, or Firm—Oblon, Fisher, Spivak, McClelland & Maier

[57] ABSTRACT

This invention provides a semiconductor memory device for an integrated circuit comprising a semiconductor substrate of a first conductivity type, a field insulation layer on the semiconductor substrate, and a switch. This switch includes a gate insulation layer, a gate electrode on the gate insulation layer, and a pair of impurity regions of a second conductivity type in the substrate adjacent to the gate electrode. The device also includes a capacitor including a first electrode connected to one impurity region, a second electrode connected to a predetermined voltage, insulation means for separating the first and second electrodes, and groove means extending into the substrate for increasing the capacitace area of the first electrode.

A method for making the devices is also described.

8 Claims, 3 Drawing Sheets

SEMICONDUCTOR MEMORY DEVICE HAVING A HIGH CAPACITANCE STORAGE CAPACITOR

BACKGROUND OF THE INVENTION

1. Field of the Invention

This invention relates to a semiconductor memory device and manufacturing method. In particular, the invention relates to an improved semiconductor memory device used as a dynamic RAM and a method of manufacturing.

2. Description of the Prior Art

Recently, although the degree of integration of dynamic RAMs has improved, the capacitor area of the memory cell also has become increasingly smaller. However, in order to prevent soft errors due to alpha-rays, capacitances of at least 50-60 if are necessary. Therefore, in order to ensure a specified capacitance even with a small capacitor area, attempts have been made to form a capacitor in a groove provided in the semiconductor substrate, as shown in FIG. 1.

In FIG. 1, for example, field oxide film 2 is formed on the surface of p-type silicon substrate 1 and the region enclosed by field oxide film 2 becomes a memory cell. A groove 3 is formed in each memory cell and a capacitor oxide film 4 is formed on the surface of substrate 1 including the inner walls of groove 3. Also, capacitor electrode 5 is formed within groove 3 over capacitor oxide film 4 and extends over field oxide film 2. Capacitor electrode 5 becomes the common electrode for a number of memory cells. A cell capacitor is formed by sandwiching capacitor oxide film 4 between substrate 1 and capacitor electrode 5 in this way, and the charge is stored in this cell capacitor.

Moreover, a transfer transistor is formed within the memory cell to transfer the charge to the cell capacitor. This transfer transistor is formed by gate oxide film 6, which is layered over substrate 1, transfer gate electrode 7 and n+type source and drain regions 8 and 9, which are formed in substrate 1 on either side of transfer gate electrode 7.

In a dynamic RAM with this type of construction, the charge enters and leaves the cell capacitor via the transfer transistor, and the charge is stored within the cell capacitor in substrate 1 in the vicinity of capacitor oxide film 4. Since a prescribed voltage is always impressed on capacitor electrode 5, the cell capacitor can be charged and discharged by controlling the voltage applied to transfer gate electrode 7.

Thus, a prescribed capacitance can be ensured, even with a small capacitor area, by providing a groove in substrate 1.

However, as the capacitor area is made even smaller in order to improve the degree of integration in a conventional dynamic RAM, it is necessary to make the groove deeper and deeper in order to ensure the prescribed capacitance for the prevention of soft errors. For instance, if the opening of the groove is taken as a square of a($\mu$m)33 a($\mu$m) and the depth is taken as h($\mu$m), the surface area inside the groove equals 4ah +a$^2$ ($\mu$m$^2$). Therefore, if the degree of integration is increased and a becomes smaller, the same capacitance cannot be ensured unless h is made considerably larger. However, the deeper the groove is made, the more extreme the difficulty of etching to form the groove, and the more difficult the washing process becomes. Moreover there is a limit to the depth of the groove.

On the other hand, increasing the capacitance by making capacitor oxide film 4 thinner can also be considered. However, when the capacitor oxide film is made thinner, an electric field concentrates at the edges of the groove bottom in particular, and there is a risk of breakdown of insulation occurring due to the generation of a tunnel current. Therefore the thickness of the capacitor oxide film cannot be reduced below a specified thickness.

SUMMARY OF THE INVENTION

An object of this invention is to ensure a specified capacitance even if the degree of integration of a semiconductor memory device is increased.

A further object of this invention is to prevent soft-errors in a semiconductor memory device.

Another object of this invention is provide a semiconductor device, which is superior in reliability and design flexibility.

This invention provides a semiconductor memory device for an integrated circuit comprising a semiconductor substrate of a first conductivity type, a field insulation layer on the semiconductor substrate, and a switch. This switch includes a gate insulation layer, a gate electrode on the gate insulation layer, and a pair of impurity regions of a second conductivity type in the substrate adjacent to the gate electrode. The device also includes a capacitor including a first electrode connected to one impurity region, a second electrode connected to a predetermined voltage, insulation means for separating the first and second electrodes, and groove means extending into the substrate for increasing the capacitace area of the first electrode.

A method for making the devices is also described.

DETAILED DESCRIPTION OF THE PREFERRED EMBODIMENT

One embodiment of this invention and its manufacturing method are described with reference to FIGS. 2(a)-(d).

Figure 2A:
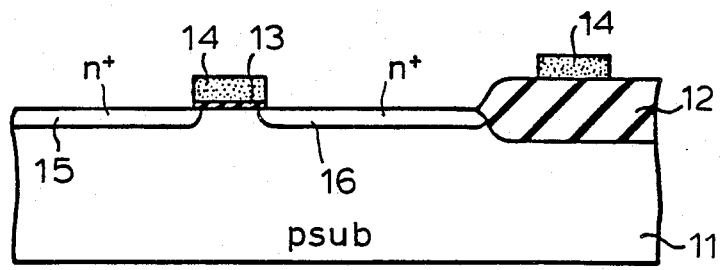
FIGS. 2(a)-(d) are cross-sectional views showing the manufacturing processes to produce the dynamic RAM according to one embodiment of this invention.

First, for example, as shown in FIG. 2(a), after forming a field oxide film 12 on the surface of a p-type silicon substrate 11, a gate oxide film 13 is formed on the surface of the memory-cell region which is surrounded by field oxide film 12. Then a first polycrystalline film is layered on the whole surface and impurity is doped. Next, transfer gate electrodes 14 are formed by patterning the first polycrystalline silicon film. Then n+type source and drain regions 15 and 16 are formed by implanting, for instance, arsenic ions using transfer gate electrodes 14 and field oxide film 12 as masks.

Figure 2B:
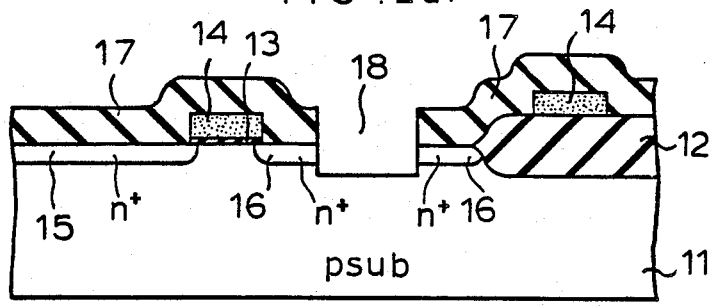

Next, as shown in FIG. 2(b), CVD (Chemical Vapor Deposition) oxide film 17 is layered over the whole surface. Then groove 18 is formed by selectively etching a part of CVD oxide film 17 over drain region 16 and then further etching a part of substrate 11.

Figure 2C:
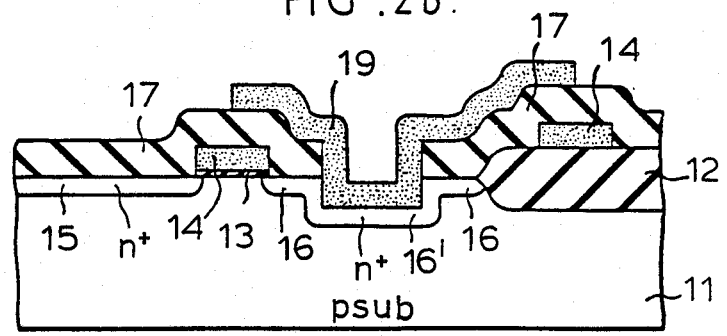

Next, as shown in FIG. 2(c), a second polycrystalline silicon layer 19 is layered over the whole surface so that it follows the side walls and bottom of groove 18, and silicon layer 19 is doped with impurity, such as As. Polycrystalline silicon film pattern 19 then has a part which is buried in groove 18 and a part which overlaps transfer gate electrodes 14, but is separated from the electrodes 14 by CVD oxide film 17. Silicon film 19 is formed by patterning the second polycrystalline silicon film. Then n+drain region 16' is formed through the diffusion of impurity from polycrystalline silicon film pattern 19 into substrate 11 by thermal processing.

Figure 2D:
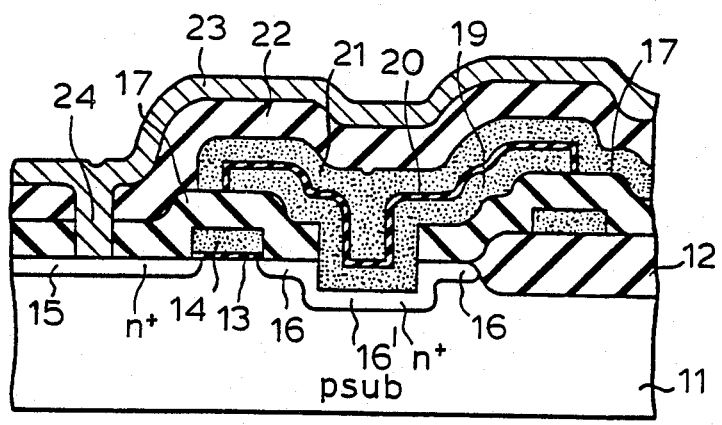

Next, as shown in FIG. 2(d), capacitor oxide film 20 is formed on the surface of polycrystalline silicon film pattern 19. Then, a third polycrystalline silicon film is layered over the whole surface and after impurity is doped, capacitor electrode (cell plate) 21 is formed by patterning. Then, after CVD oxide film 22 is layered over the whole surface, a contact hole 24 is bored. Then, after an Al film is vapour-deposited over the whole surface, bit line 23 is formed by patterning the Al film and a dynamic RAM is produced.

The dynamic RAM shown in FIG. 2(d) has a structure provided as follows. Gate oxide film 13 and transfer gate electrodes 14 are formed on a p-type silicon substrate 11 by layering. N+type source region 15 and n+type drain regions 16 and 16' having groove 18 are formed on the surface of substrate 11 on either side of this transfer gate electrode 14. Part of polycrystalline silicon film pattern 19 is connected to drain regions 16 and 16' by being buried in groove 18 and part is extended so that it overlaps transfer gate electrode 14 but is separated by CVD oxide film 17. Capacitor oxide film 20 is formed on polycrystalline silicon film pattern 19 and capacitor electrode 21 is formed on capacitor oxide film 20.

Figure 1:
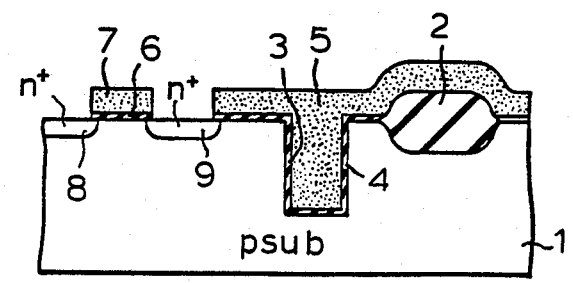
FIG. 1 is a cross-sectional view of a conventional dynamic RAM.

In a dynamic RAM with this kind of structure, a capacitor is constructed by polycrystalline silicon film pattern 19, capacitor oxide film 20 which is formed on its surface and capacitor electrode 21. The charge is stored on polycrystalline silicon film pattern 19. Polycrystalline silicon film pattern 19 is formed along the inner walls of groove 18, which is formed by etching CVD oxide film 17 and substrate 11. Moreover, a part of polycrystalline silicon film pattern 19 overlaps transfer gate electrode 14, but is separated from gate electrode 14 by CVD oxide film 17. Since polycrystalline silicon film 19 extends over a broad area in the transverse and vertical directions, the area of the capacitor becomes very large. For this reason, in order to improve the degree of integration, it is not necessary to deepen the etching depth of substrate 11 when forming groove 18, as in the conventional dynamic RAM shown in FIG. 1, even if the memory cell is made smaller. Therefore, there is no difficulty in carrying out the etching process or the washing process in order to form groove 18, and sufficient capacitance can be obtained to prevent soft errors.

Moreover, although leak currents occur from the inversion layer induced in order to form storage capacity in a conventional dynamic RAM, in the case of the dynamic RAM in the above embodiment, the charge is stored in polycrystalline silicon film pattern 19, and since leak currents based on the above causes do not exist, information storage time may be greatly increased.

As described above, when using this invention, a semiconductor memory can be provided in which a specified capacitance can be ensured, even if the degree of integration is increased. The memory device also has greater resistance to soft errors and a longer information storage time.

Figure 3:
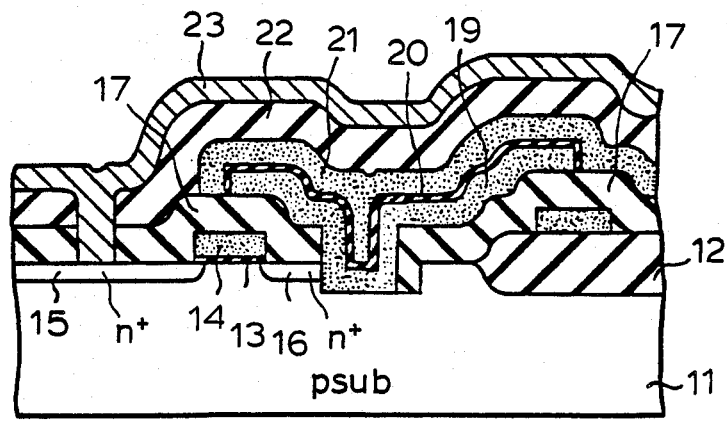
FIG. 3 is a cross-sectional view showing the semiconductor device according to another embodiment of this invention.

Another embodiment of this invention will be described with reference to FIG. 3.

The manufacturing method of this embodiment is almost the same as the embodiment shown in FIGS. 2 (a) to (d). The differences between these two embodiments are that a portion of CVD film 17 is left in groove 18 and drain region 16 is formed along only one side of groove 18. In this embodiment, since a portion of CVD film remains, the semiconductor memory devices can be formed closer to one another. As a result, field oxide film 12 can be omitted.

In this type of semiconductor memory, the capacitor is formed by the conductive layer, the capacitor insulating film and the capacitor electrode, and the charge is stored in the conductive layer. Since this conductive layer is formed over a wide area following the groove in the vertical direction and in the horizontal direction and extending as far as over the gate electrode, the capacitor area is very large. Therefore, even if the memory cell becomes smaller, a sufficient capacitance can be obtained to prevent soft errors.

Various modifications and variations could be made to the invention without departing from the scope or spirit of the invention.

What is claimed is:

1. A semiconductor memory device for an integrated circuit comprising:

a semiconductor substrate of a first conductivity type;

a field insulation layer on the semiconductor substrate;

a switch including a gate insulation layer, a gate electrode on the gate insulation layer, and a pair of impurity regions of a second conductivity type in the substrate adjacent to the gate electrode;

a capacitor including a first electrode connected to one impurity region, a second electrode connected to a predetermined voltage, first insulation means for separating the first and second electrodes, and groove means extending into the substrate to a predetermined depth for increasing the capacitance area of the first electrode; and second insulation means at least partially overlapping one of the impurity regions adjacent said groove means;

wherein the groove means includes a groove intersecting said one of the impurity regions and said second insulation means and extending into the semiconductor substrate, each of the first and second electrodes and the first insulation means being in part in the groove and in part extending outside the groove and overlapping a part of said second insulation means thereby to increase the capacitance of said capacitor.

2. A semiconductor device according to claim 1, wherein the groove means includes a groove connected to one of the impurity regions and including a portion extending into the semiconductor substrate.

3. A semiconductor device according to claim 1, wherein a part of each of the first and second electrodes and the capacitor insulation layer is within the groove.

4. A semiconductor device according to claim 1, also including a first insulating film within the groove.

5. A semiconductor device according to claim 1, also including a second insulating film between the first electrode and the gate electrode.

6. A semiconductor device according to claim 1, wherein said second insulation means comprises a first portion overlapping said one of said impurity regions and said gate electrode, said first electrode, first insulation means and second electrode of said capacitor overlapping said gate electrode and separated therefrom by said first portion of said second insulation means.

7. A semiconductor device according to claim 6, wherein said second insulation means comprises a second portion overlapping a gate electrode of an adjacent memory device, said first electrode, first insulation means and second electrode of said capacitor overlapping said gate electrode of said adjacent memory device and separated therefrom by said second portion of said second insulation means.

8. A semiconductor device according to claim 7, wherein said second portion of said second insulation means extends into said groove.

* * * * *